United States Patent [19]

Werther

[11] Patent Number: 4,750,092
[45] Date of Patent: Jun. 7, 1988

[54] INTERCONNECTION PACKAGE SUITABLE FOR ELECTRONIC DEVICES AND METHODS FOR PRODUCING SAME

[75] Inventor: William E. Werther, Glen Cove, N.Y.

[73] Assignee: Kollmorgen Technologies Corporation, Dallas, Tex.

[21] Appl. No.: 918,563

[22] Filed: Oct. 20, 1986

Related U.S. Application Data

[63] Continuation-in-part of Ser. No. 800,050, Nov. 20, 1985, abandoned.

[51] Int. Cl.$^4$ ............................................. H05K 7/02
[52] U.S. Cl. ..................................... 361/400; 29/830; 156/629; 361/386
[58] Field of Search ............... 361/386, 397, 398, 399, 361/400, 401, 402, 403, 404, 405, 406, 396, 412, 413, 393, 395; 339/17 C; 29/830, 837, 839, 848, 849; 357/81; 174/52 FP

[56] References Cited

U.S. PATENT DOCUMENTS

| | | | |
|---|---|---|---|
| 3,495,023 | 2/1970 | Hessinger | 174/52 FP |
| 4,074,342 | 2/1978 | Honn et al. | 361/411 |
| 4,082,394 | 4/1978 | Gedney et al. | 361/403 |
| 4,132,856 | 1/1979 | Hutchinson et al. | 174/52 PE |
| 4,396,936 | 8/1983 | McIver et al. | 357/81 |
| 4,396,971 | 8/1983 | Beall et al. | 361/388 |
| 4,420,877 | 12/1983 | McKenzie, Jr. | 339/17 X |
| 4,437,141 | 3/1984 | Prokop | 361/403 |
| 4,602,318 | 7/1986 | Lassen | 361/406 |
| 4,618,739 | 10/1986 | Theobald | 174/52 FP |

FOREIGN PATENT DOCUMENTS 0013562 8/1982 European Pat. Off. .

OTHER PUBLICATIONS

Foster et al., "Thermally Enhanced Package for Semiconductor Devices", Dec. 1977.

Primary Examiner—A. D. Pellinen
Assistant Examiner—Morris Ginsburg
Attorney, Agent, or Firm—Morgan & Finnegan

[57] ABSTRACT

An interconnecting package for attaching electronic devices, such as semiconductor chips, to an interconnection board and processes for the production and mounting thereof. The interconnection package comprises a multiplicity of metallic leads or pins aligned in a regular array and a first substrate of molded plastic material around the metallic leads or pins with the metallic leads or pins extending through the first substrate. A conductive pattern is formed on a surface, the conductive pattern being adapted to electrically connect to the electronic device, and the conductive pattern extends into a multiplicity of recesses. Each of said metallic leads or pins extends into a corresponding recess and makes an electrical connection to the conductive pattern within the recess.

42 Claims, 10 Drawing Sheets

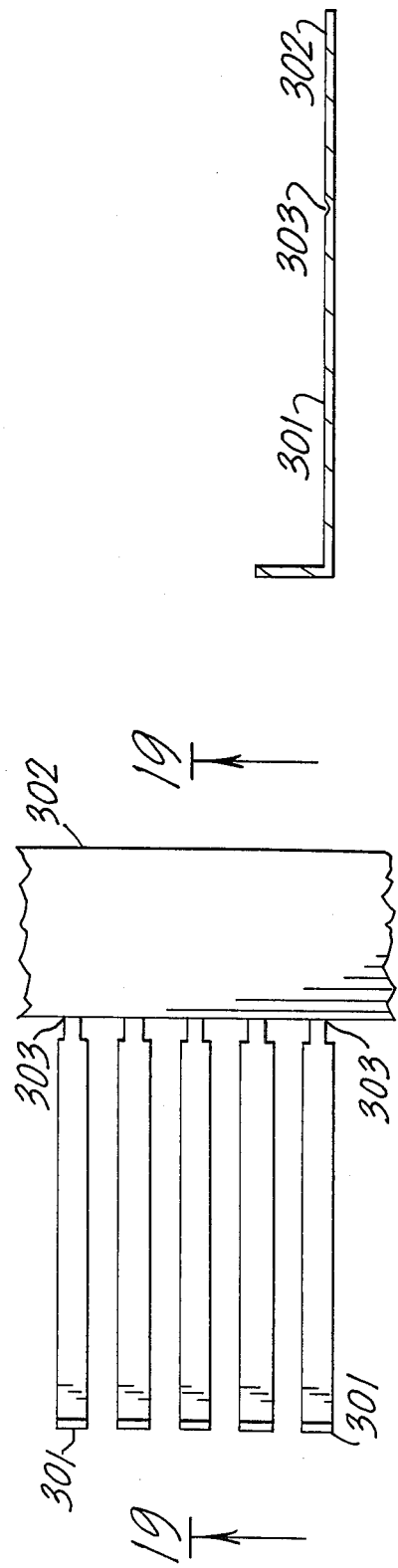
FIG. 18
FIG. 19
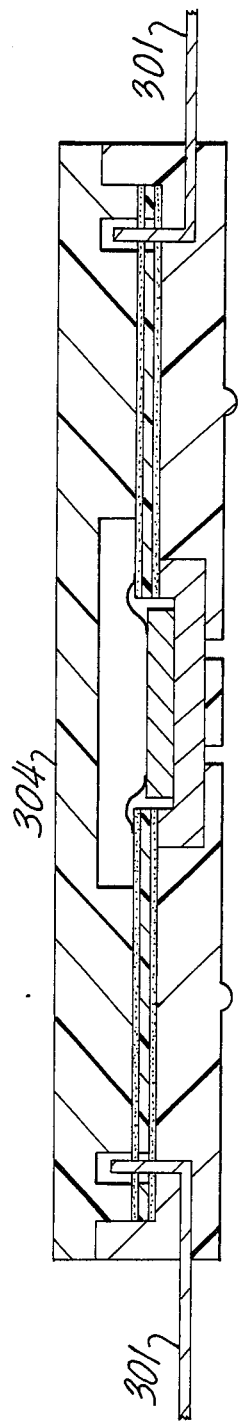
FIG. 20

INTERCONNECTION PACKAGE SUITABLE FOR ELECTRONIC DEVICES AND METHODS FOR PRODUCING SAME

RELATED APPLICATIONS

This application is a continuation-in-part of copending U.S. patent application Ser. No. 06/800,050, filed Nov. 20, 1985, now abandoned.

BACKGROUND OF THE INVENTION

The invention relates to electrical packages and processes for assembly and mounting thereof. More particularly, the invention relates to leaded packages providing large numbers of pin connections and processes for assembly and mounting thereof.

Pin grid array packages, such as multilayer co-fired alumina ceramic pin grid arrays typically have been produced by molybdenum or tungsten metalization of unfired cast alumina. An attach recess is provided in the upper layer and holes are punched in the green alumina to allow inter-level metalization. The green alumina is then fired. Pins are welded to the metalization on the bottom of the package providing electrical contact points protruding from the package. A semiconductor chip is placed in the attach recess, adhesive bonded into place, and wire bonded to the metalization. Finally, a protective cover is placed over the semiconductor chip and the package is sealed.

Printed circuit versions of pin grid array packages incorporate typical printed circuit laminates (epoxy/glass and polyimide/glass) with etched copper conductors. One approach involves a construction very similar to that employed in the conventional ceramic package with multiple circuit layers providing space for conductors, a die attach area (recessed), and pin connections. Rather than being welded, the pins typically are press-fit into plated-though holes and are sometimes soldered as well. The semiconductor chip is adhesive bonded into the recess and connected to the etched conductors by wire bonding.

An alternate printed circuit package structure involves a single-layer construction with holes and pins soldered therein. An attach recess is formed by machining a recess in the substrate to the desired depth. This approach reduces material costs but the depth and flatness of the machined attach recess are difficult to control and can result in excess stress on the wire bonds.

U.S. Pat. No. 4,074,342 to Honn et al describes a non-wire-bonded method where the semiconductor chip is "flip chip" mounted. The pin grid array is mounted in a plastic substrate whose thermal expansion is restrained. In the preferred embodiment, the semiconductor chip is not directly connected to the pin grid array but rather a circuit transposer is placed between them. The circuit transposer comprises a semiconductor material with conductors thereon that link the attached semiconductor chip to the pin grid array. This configuration eliminates mechanical stress on the solder joints which would otherwise occur from thermal coefficient of expansion mismatch between packaging materials. While this eliminates some of the thermal limitations of pin grid array packages, it is considerably more complex to produce. In one embodiment of Honn et al, the pins are extended at ½ inch (13 mm) before engaging the circuit transposer in order to accommodate mechanical stresses and the through connections in the transposer are etched to provide a small socket which facilitates positioning of the engaging pin and enhances the mechanical stress resistance.

In yet another embodiment, Honn et al dispenses with the transposer and forms a metallic conductive pattern directly on the plastic base to connect the pins to the flip chip. In both approaches, the processing of the component after the pins are in place can adversely affect the dimensional stability of the pin grid array.

While these alternative approaches represent some improvement, they are still cumbersome to produce and assemble and present limitations in terms of mechanical, electrical, and thermal characteristics of the completed pin grid array package.

SUMMARY OF THE INVENTION

With the foregoing in mind, it is an object of the invention to provide new and improved interconnection packages, such as pin grid array packages and processes for the production thereof.

It is a further object of the invention to provide a new and improved method for mounting leaded components on interconnection boards.

In one aspect, this invention concerns an interconnection package for attaching electronic devices, such as semiconductor chips, to an interconnection board, comprising a multiplicity of metallic leads or pins aligned in a regular array, a first substrate of molded plastic material around the metallic leads or pins, the metallic leads or pins extending through the first substrate, a conductive pattern formed on a surface, the conductive pattern being adapted to electrically connect to the electronic device, the conductive pattern extending into a multipicity of holes or recesses, and each of the metallic leads or pins extending into a corresponding hole or recess and making an electrical connection to the conductive pattern within the hole or recess. In another aspect, this invention concerns a method of producing an interconnection package in which at least one electronic device, such as a semiconductor chip, is attached to metallic conductors, which package is suitable for mounting on and electrically connecting to an interconnection board, the method comprising providing a multiplicity of metallic leads or pins, molding a plastic material around the multiplicity of metallic leads or pins to form a first substrate which contains a multiplicity of inserts comprised of the metallic leads or pins aligned in a regular array, the multiplicity of inserts extending through the first substrate, providing a surface suitable for mounting the electronic device, providing a conductive pattern on the surface to connect to the electronic device, the conductive pattern extending into a multiplicity of holes or recesses in the surface adapted to receive the multiplicity of inserts, the conductive pattern making electrical contact with the multiplicity of inserts, and mounting the electronic device on the surface and electrically connecting it to the conductive pattern.

In another aspect, this invention concerns a method of attaching a pin grid array package to an interconnection board, comprising the steps of providing a pin grid array package having a multiplicity of pins extending therefrom, molding an interconnection board with a multiplicity of recesses in the surface thereof adapted to receive the multiplicity of pins, creating a conductive pattern on the surface of the interconnection board, the conductive pattern extending into said multiplicity of holes or recesses, and inserting the multiplicity of pins of the pin grid array package into the multiplicity of recesses and making electrical contact with the conductive pattern within the holes or recesses.

BRIEF DESCRIPTION OF THE DRAWINGS

The accompanying drawings, referred to herein and constituting a part hereof, illustrate preferred embodiments of the invention and, together with the description, serve to explain the principles of the invention, wherein:

FIG. 18 is a plan view of an alternative contact lead according to the invention;

FIG. 19 is a side sectional view taken along line 19—19 of FIG. 18; and

FIG. 20 is a side sectional view of a thin layer package incorporating the alternative contact leads of FIG. 18.

DETAILED DESCRIPTION OF THE DRAWINGS

The embodiments according to the invention herein described include five basic aspects, namely, cavity down pin grid array packages, cavity up pin grid array packages, thin layer pin grid array packages, multilayer pin grid array packages, component mounting and component carriers. For convenience, each aspect of the invention will be described separately.

A. CAVITY DOWN PIN GRID ARRAY PACKAGES

The cavity down pin grid array package according to the invention includes two basic components, namely, a molded pin grid array and a molded base on which electronic devices are mounted. The base includes molded-in recesses for receiving pins and a conductive pattern to connect the pins and recesses to the electronic devices.

Preferably, the base is injection molded including a multiplicity of tapered pin recesses and an attach recess for holding an electronic device. A conductive pattern is established on the surface of the base and may consist of a series of conductors that begin at the edge of the attach recess and extend in a generally radial manner towards and into the tapered pin recesses. The conductor ends provide an electrical contact surface in the tapered pin recesses.

One or more electronic devices, such as semiconductor chips, may be attached to the base in the attach recess. The electronic devices are connected to the conductors on the surface of the base by conventional wire bonding techniques. The wire bonded electronic devices in the attach recess may be encapsulated to protect the wire bonds. The base may also include a heat sink in the attach recess in thermal contact with the electronic devices.

The pin grid array is also injection molded and includes an array of pins extending through the molded material. The pins are adapted on one end to extend into corresponding recesses and make electrical connection with the conductive pattern on the base. The other end of the pins are adapted for insertion into a printed wiring board or other interconnection medium.

The pin grid array is preferably attached to the base so that each pin of the pin grid array extends into a corresponding tapered recess molded in the base by a press fit and makes electrical contact with the conductive pattern. To protect the assembled pin grid array package, the interface between the base and the pin grid array may be sealed by an adhesive or by ultrasonic welding.

Figure 1:
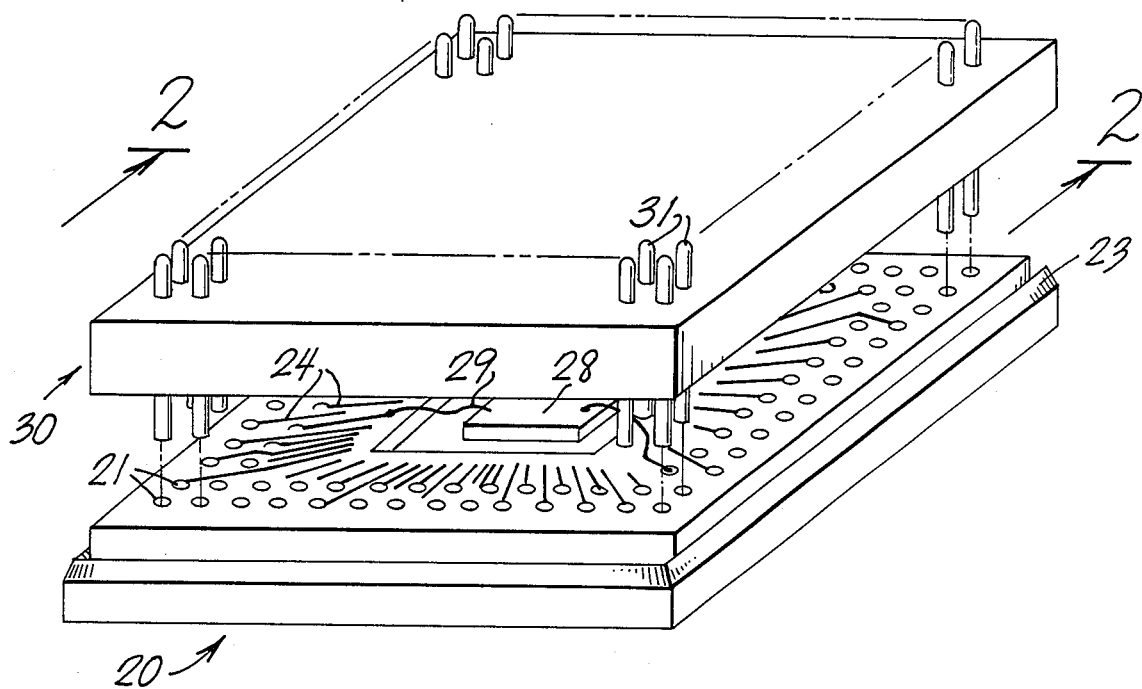
FIG. 1 is an exploded perspective view of the cavity down pin grid array package.
Figure 2:
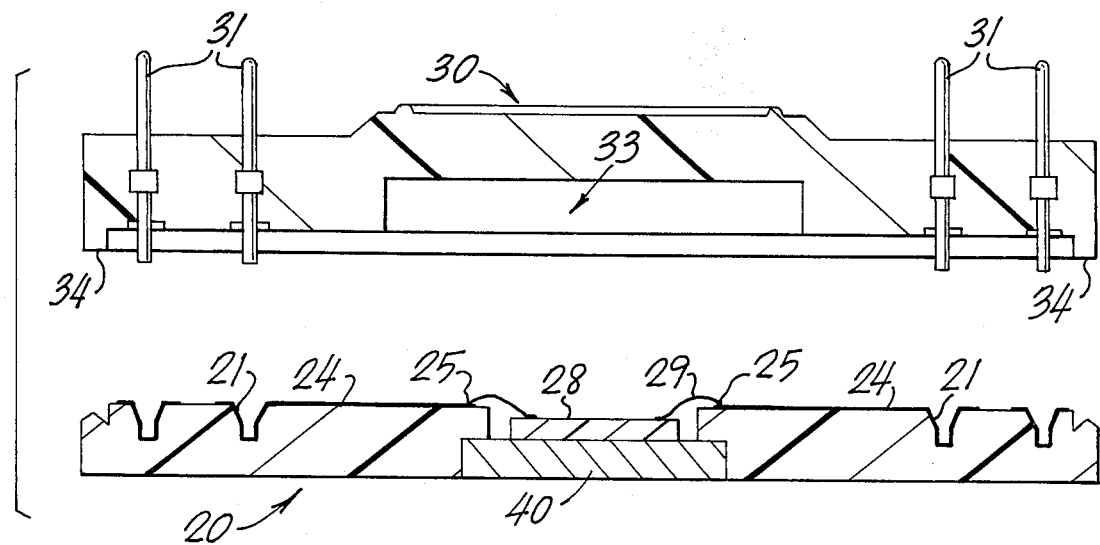
FIG. 2 is a sectional view taken along line 2—2 of FIG. 1.
Figure 3A:
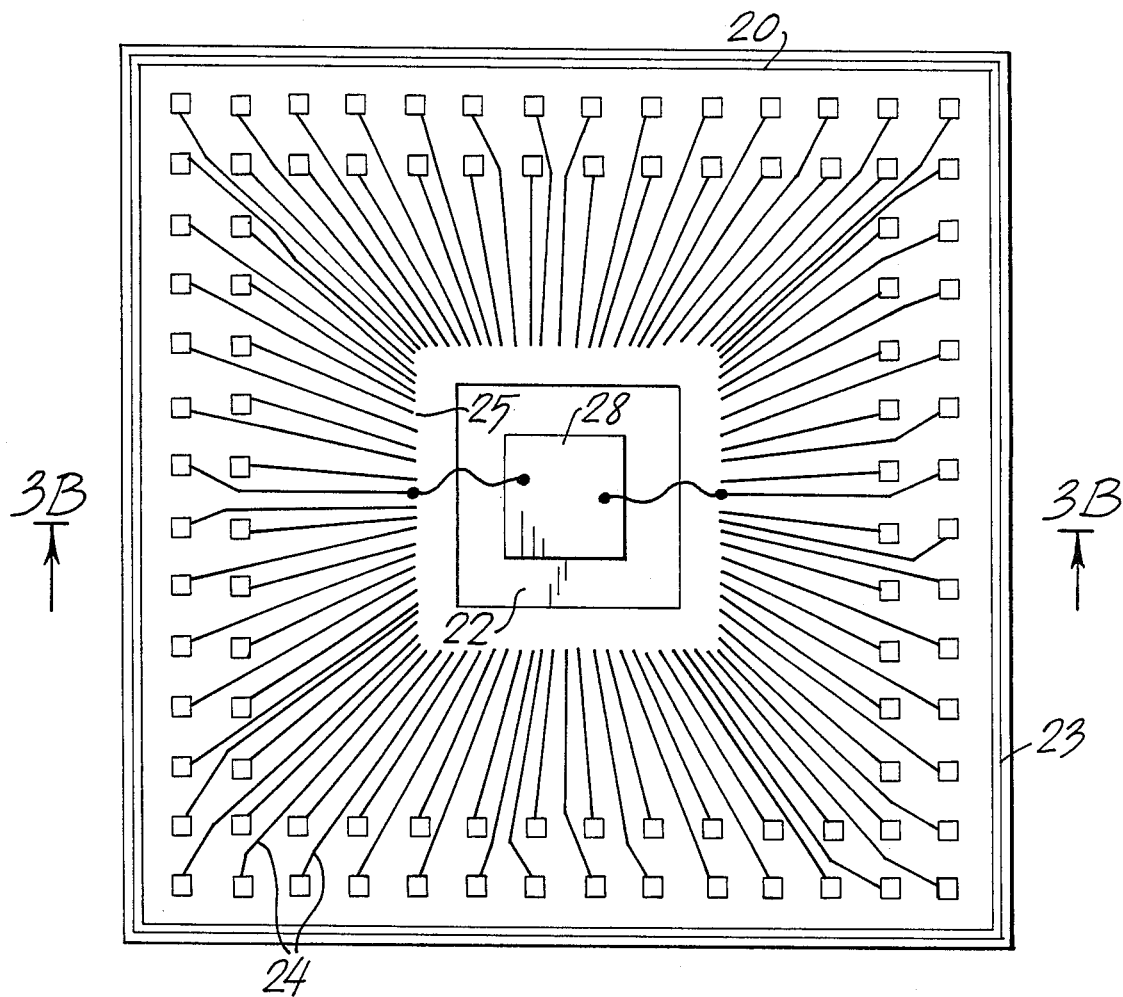
FIG. 3A is a plan view of the base of the cavity down pin grid array package.
Figure 3B:
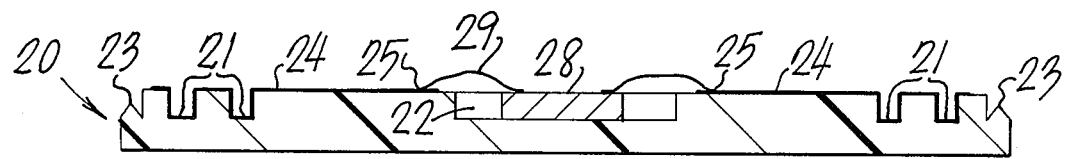
FIG. 3B is a sectional view taken along line 3B—3B of FIG. 3A.

In the preferred embodiment, base 20 is injection molded and appears as shown in FIGS. 3A and 3B. Molded into base 20 are a multiplicity of pin recesses 21, an attach recess 22, and an energy director 23. Additional features, e.g., a heat sink 40, can also be molded into the base. Energy director 23 comprises a pointed ridge around the periphery of base 20. The energy director serves to concentrate the energy developed in ultrasonic welding in order to fuse the material of the base as is further described below.

Generally, mineral filled thermoplastics including polysulfones, polyethersulfones, polyetherimides, polyarylsulfones, and polyesters are suitable material for the base due to their moldability, dielectric constants, dissipation factors, moisture resistances, tensile strengths, and surface finishes. Any molded thermoset plastic may also be used, for example, epoxy, phenolic, diallyl phthalate, or polyimide. Fillers that may be used are mineral powders such as wollastonite, calcium carbonate, alumina silicates and clays, and fibrous reinforcements such as chopped glass fibers and milled glass.

A preferred material is a mineral filled polyarylsulfone (Union Carbide's "Radel"). The mineral filler should preferably be a platelet-type such as 300 mesh mica. Platelet-type mineral fillers align their platelets with the molded surface of the part on molding and thereby produce a surface that is flatter and more resistant to warpage. It is important in the molding of the base to maintain a precise barrel and mold temperature as they directly affect the quality of the surface of the molded part. For ease of processing, the base 20 may be molded in multiples joined together in a sheet. After molding, the base is annealed to remove any stresses that may have been induced in the molding operation thereby avoiding stress cracks during later processing.

The surface of the molded base is metalized to create conductive pattern 24 thereon. A preferred technique is to prepare the surface by applying a solvent to swell the surface to be plated and thereby expose the mineral filler. The solvent of choice is a weak solution of N-methyl pyrrolidone (Shipley's "PM 921"). The surface is then adhesion promoted by pre-etching the surface and exposed mineral filler with sulfuric acid and then etching the mineral with chromic acid leaving etch pits in the surface. (This process is referred to below as the "swell and etch" process.) Typical swell and etch techniques are taught in U.K. Pat. No. 1,381,243 and in Frisch et al, U.S. Pat. No. 4,424,095, both of which disclosures are incorporated by reference herein.

The roughened surface is palladium activated and electroless copper is grown from the palladium sites in a conventional electroless copper bath creating a continuous coverage of copper on the surface. Copper is then plated on the surface until the entire surface is covered with a thick layer of copper approximately 0.0005 inches (13 micrometers) thick. The plated surface is subsequently laminated with a conventional aqueous dry film photoresist and imaged to leave polymerized resist in a negative image of the desired conductive pattern 24. The exposed copper areas are plated with nickel, with the photoresist acting as a plating resist, such that nickel is only plated according to conductive pattern 24. Copper is then plated onto the nickel to prevent passivation of the nickel which would otherwise result in a non-removable nickel oxide coating.

The conductive pattern 24 is then screen printed with a conventional aqueous resist ink leaving only the ends of conductors 25 at the attach recess 22 and at the tapered pin recesses 21 exposed. Ends of conductors 25 and tapered pin recesses 21 are selectively plated with a layer of approximately 150 millionths of an inch of nickel followed by approximately 40 millionths of an inch of soft (wire bondable) gold. The photoresist (both dry film and ink) are stripped away with an alkaline solution and the exposed copper areas are etched using standard cupric chloride or similar etchants. The nickel and gold act as etch resists leaving only the desired conductive pattern 24 on the surface. Thereafter, the surface is ammonia-dipped in order to remove any copper ions from the gold to insure a bondable surface. Base 20 is then fabricated (e.g., cut by diamond saw) to the desired final assembly form as a single piece, pallet, or strip form.

Semiconductor chip 28 is attached to base 20 by an epoxy adhesive (not shown) and is connected to conductors 25 by conventional wire bonding techniques. After it is wire bonded, the semiconductor chip 28 may be encapsulated in an insulating epoxy or similar material to further protect the semiconductor chip 28 and the wire bonds 29 from damage.

Figure 4A:
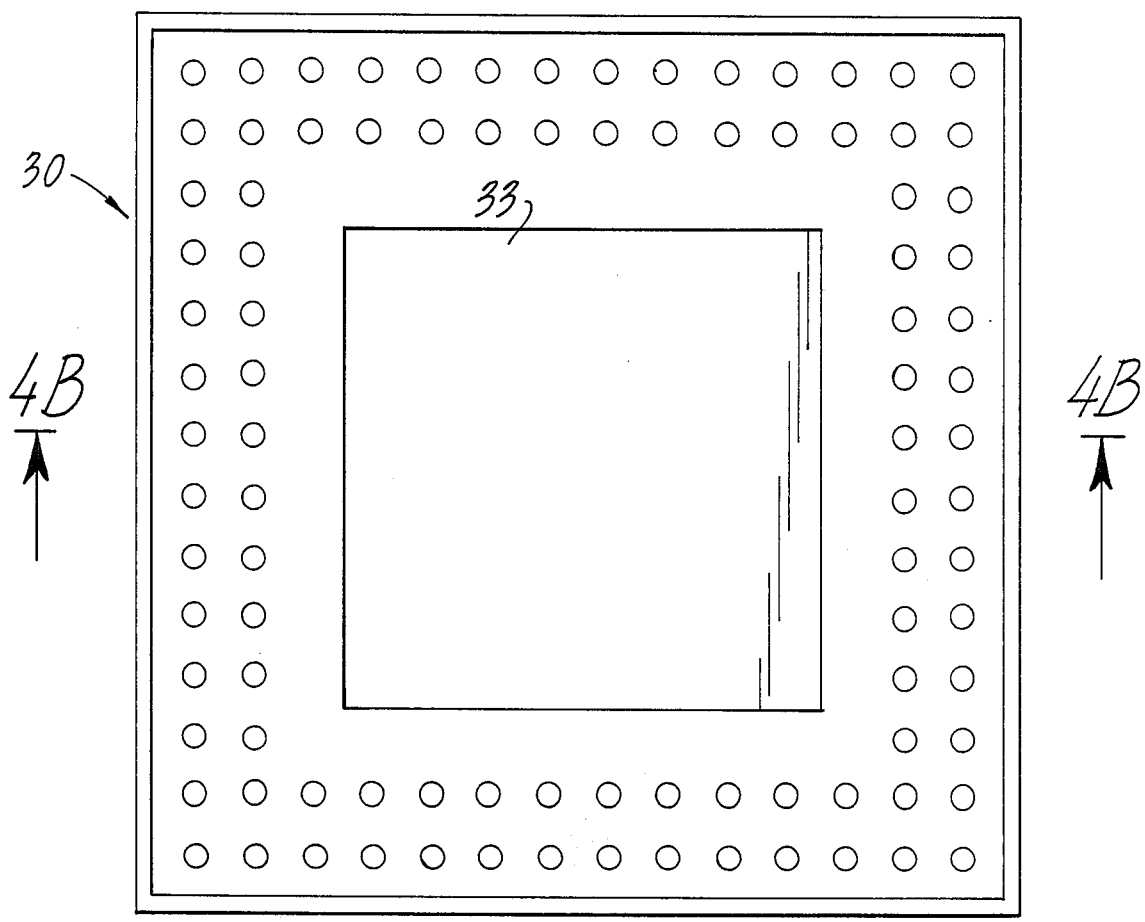
FIG. 4A is a plan view of the pin grid array of the cavity down pin grid array package.
Figure 4B:
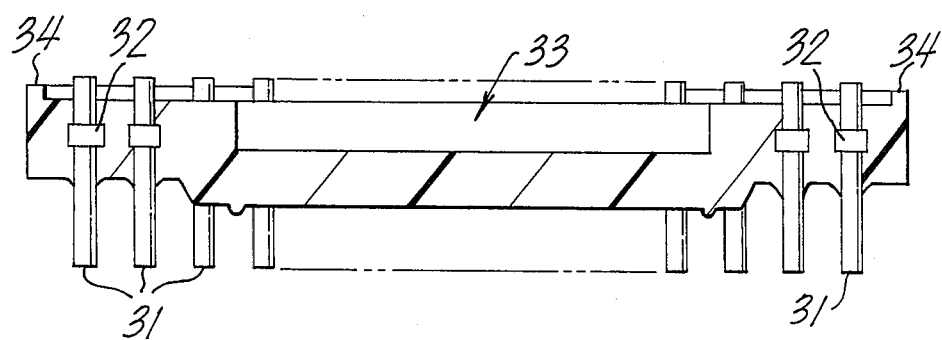
FIG. 4B is a sectional view taken along line 4B—4B of FIG. 4A.

As shown in FIG. 4A and 4B, pin grid array 30 is injection molded and provides a multiplicity of insert molded pins 31 which may be starred or otherwise deformed at their center region 32 to provide a mechanical anchor into pin grid array 30. The pins 31 extend out of the molded material on both sides and are adapted on one end to extend into the corresponding tapered pin recesses 21 on base 20 and the other to make contact with a printed wiring or interconnection board (not shown). Recess area 33 is also provided to allow clearance for the wire bonded semiconductor chip 28 and a ridge 34 is provided to mate with energy director 23.

Pin grid array 30 is registered over base 20 such that the pins 31 of pin grid array 30 align with the tapered pin recesses 21 of the base. The pins 31 of pin grid array 30 make electrical contact with conductive pattern 25 in the corresponding tapered pin recesses 21 of base 20.

The preferred method of attaching base 20 to pin grid array 30 is by an ultrasonic welding technique. The ultrasonic welding tool contacts the assembly and imparts pressure to the mated base 20 and pin grid array 30. Ridge 34 running around the periphery of pin grid array 30 contacts the top of energy director 23, and the pointed ridge of the energy director concentrates the ultrasonic energy fusing the molded pieces at the contact point. Continued pressure from the tool fuses energy director 23 with ridge 34 and further press-fits the pins 31 into the tapered pin recesses 21. Thereafter, pin grid array 30 and base 20 are held together for a brief time allowing the melted plastic to cool. It will be appreciated by the skilled artisan that a variety of other joining techniques, such as heat welding or adhesive bonding, may also be utilized.

Figure 5A:
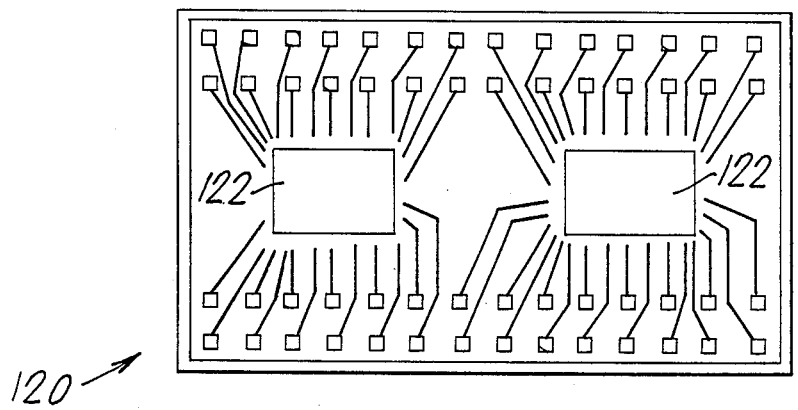
FIG. 5A is a plan view of the base of an alternative embodiment of the cavity down pin grid array package.
Figure 5B:
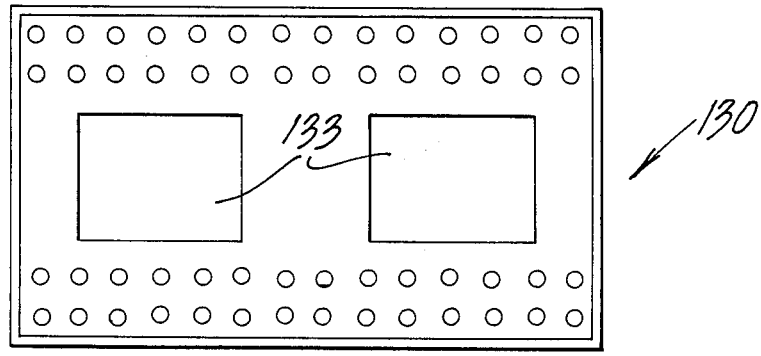
FIG. 5B is a plan view of the pin grid array of an alternative embodiment of the cavity down pin grid array package.

FIG. 5A and 5B illustrate an alternative embodiment of the invention wherein more than one semiconductor chip is to be included in the package. Base 120 is injection molded with two attach recesses 122 and pin grid array 130 provides two recess areas 133 for clearance. The recesses can house semiconductor chips or other electronic devices. Other details of fabrication and assembly are as previously described.

It will be appreciated that pin locations in the cavity down pin grid array packages according to the invention are more accurately controlled than in currently available ceramic and printed circuit laminate pin grid array packages since the pins are accurately located in the molded pin grid array, which is not thereafter subjected to heat treatment, and any pin movement required in attaching the base does not affect the pins emerging from the package. The thermal coefficient of expansion of the molded plastic pin girard array is better matched to that of printed wiring base laminates than are ceramic pin grid array packages. Additionally, the base with the conductive pattern is relatively easy to process as it does not include any pins.

B. CAVITY UP PIN GRID ARRAY PACKAGES

Usually, cavity down packages are employed when heat from the semiconducter chip is dissipated by diffusion through the base and the heat is removed by convection cooling air blown across the top of the base. A cavity up configuration is used when it is desired to have the semiconductor chip mounted against the printed wiring board so that the heat can be removed by conduction through the printed wiring board. When compared with the cavity down pin grid array package, the cavity up pin grid array package's major difference is the location of the insert molded pins. In the cavity down configuration, the pins are insert molded in a separate pin grid array which also acts as a cover for the pin grid array package. In the cavity up configuration, the pins are insert molded into the same component as the attach recess and tapered pin recesses. In most other respects, the two configurations are similar in design.

Figure 6:
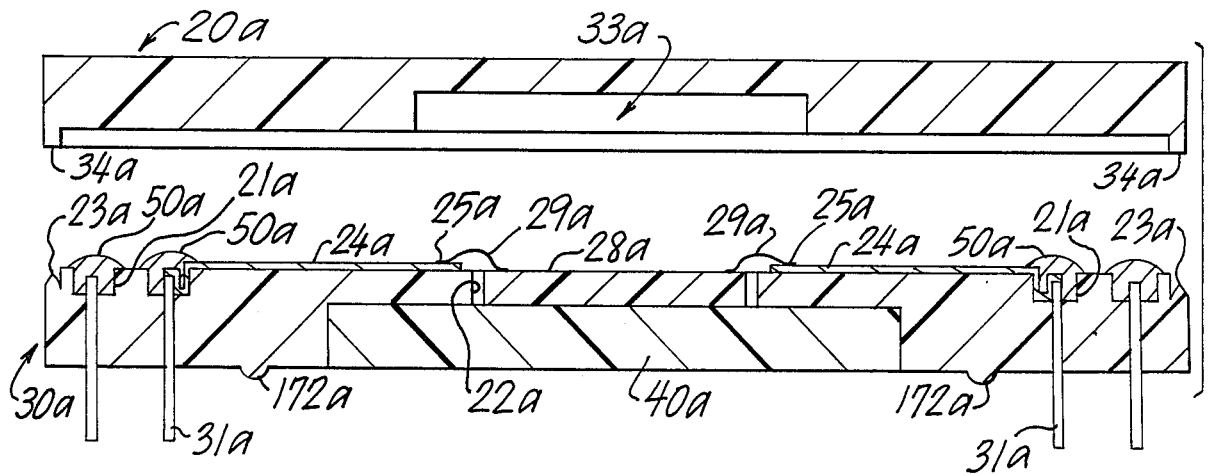
FIG. 6 is an exploded sectional view of the cavity up pin grid array package.

As preferably embodied, a cavity up pin grid array package is injection molded and appears as shown in FIG. 6. Molded into the pin grid array 30a are a multiplicity of pin recesses 21a, a multiplicity of pins 31a, an attach recess 22a, and an energy director 23a.

The pins 31a extend out of the molded material on both sides and maybe adapted on one end to extend into the corresponding tapered pin recesses 21a, but not above the planar surface of the molded material, in the pin grid array 30a and on the other to make contact with an interconnection board (not shown). Additional features, as described above for the cavity down pin grid array packages, may also be incorporated into the cavity up pin grid array package (e.g., heat sink 40a or starred pins).

The surface of the molded pin grid array 30a is metalized to create a conductive pattern 24a thereon. Three processes may be mentioned for producing a conductive pattern on the cavity up pin grid array. It would be appreciated by those skilled in the art that these processes could also be used in cavity down design. As each is significantly different, they are explained separately below.

In the semi-additive process, as described for the cavity down pin grid array packages previously, the surface of the molded part undergoes the "swell and etch" surface roughening process. The roughened surface is palladium activated and the entire part is then plated with a thin (1/10 mil or 2.5 micrometer) deposit of copper electrolessly deposited on the palladium sites. The plated surface is subsequently laminated with a conventional aqueous dry film photoresist and imaged to leave polymerized resist in a negative image of the desired conductive pattern 24a. The exposed copper areas are plated with nickel, with the photoresist acting as a plating resist, such that nickel is only plated according to the conductive pattern 24a. Copper is then plated onto the nickel to prevent passivation of the nickel which would otherwise result in a non-removable nickel oxide coating. The conductive pattern 24a is then screen printed with a conventional aqueous resist ink leaving only the ends of conductors 25a at the attach recess 22a and at the tapered pin recesses 21a exposed. The ends of the conductors 25a and the tapered pin recesses 21a are selectively plated with a layer of approximately 150 millionths of an inch of nickel followed by approximately 40 millionths of an inch of soft (wire bondable) gold.

The photoresists (both dry film and ink) are stripped away with an alkaline solution and the exposed copper areas are etched using standard cupric chloride or similar etchants. The nickel and gold act as etch resists leaving only the desired conductive pattern 24a on the surface. Thereafter, the surface is ammonia-dipped in order to remove any copper ions from the gold to insure a bondable surface. Although this process involves many process steps, the process is fully defined, produces excellent electrical connections, and has defined bondability.

In the additive process, a palladium catalyzed material as described by Schneble et al in U.S. Pat. Nos. 3,546,009, 3,600,330, and 3,629,185 the disclosures of which are incorporated herein by reference, is employed as the molding material. The low level (less than 1%) of palladium that is compounded in the molding material is sufficient to render the material catalytic for electroless plating, but has little or no effect on the electrical characteristics of the material. The molded part is first adhesion promoted with the above "swell and etch" process. A permanent plating mask is then applied. The part is then electrolessly plated with copper to the full desired conductor thickness (typically 0.001" or 25 micrometers). A second layer of permanent mask is subsequently applied, and the part is then ready for preparation of the surface for wire bonding.

Incorporation of the selective wire bondable surface can take one of two forms: either an electrolessly deposited metal of wire bondable quality (typically Au over Ni or Ni/Boron) or a printed and cured polymer thick film. It will be appreciated by the skilled artisan that if the thick film approach is chosen, the processing sequence may have to be modified so that no mask exists on the board prior to curing the wire bondable surface, dependent on the cure temperature of the particular material chosen. The advantages of this process are that it is simple, requires no etching (produces extremely fine lines) and produces excellent electricals.

The third process is the polymer thick film process involving screen printing of multiple layers of thick film insulators and conductive material to form the conductive pattern of the pin grid array. It is anticipated that at most three distinct screenings of conductive material will be necessary: one to form the actual conductive pattern, a second to form the electrical connection between the pin and the conductive pattern and a third to form the wire bondable surface. It should be noted that an alternative to screen printing the wire bondable surface would be to use a platable ink to form the conductive pattern, and utilize electroless plating (Au and/or Ni) to provide the final bondable surface. The advantages of the thick film process are that it is the most simple process, has simple pin to circuit connections, and allows a more flexible choice of substrate resin systems.

As compared to the press fit pin to plated recess arrangement of the cavity down pin grid array package, the interface between conductive pattern and pins in the cavity up configuration is significantly simplified. The nature of this connection, which could take one of two forms depending on the process employed, is as follows.

For the semi-additive and additive processes, the pin-to-conductive-pattern connection involves plating over the pin 31a and into the pin recess 21a surrounding it. A solder paste 50a is applied to the pin recesses 21a and the paste is subsequently reflowed. For the thick film part, the pin-to-conductive-pattern connection is accomplished by flooding the pin recess between the pin and the molded material with a conductive epoxy or similar material (not shown). Either of these alternatives form a very simple pin-to-conductive-pattern electrical and mechanical connection. They have the benefit of providing a connection around the entire diameter of the pin 31a, while still being a "single-sided" connection. A semiconductor chip 28a may thereafter be attached to the cavity up pin grid array package as described for the cavity down pin grid array package configuration above.

A molded cover 20a may be provided and is registered over the cavity up pin grid array 30a and provides a recess area 33a to allow clearance for the wire bonded semiconductor chip 28a and a ridge 34a to mate with energy director 23a. The preferred method of attaching cover 20a and pin grid array 30a is by an ultrasonic welding technique as described above.

An alternative method of package encapsulation is transfer molding. A benefit of transfer molding is the superior package integrity and reliability that can be achieved, from an environmental standpoint, with this approach. Transfer molding is extremely compatible with a molded pin grid array package design in that the transfer molding process can be thought of as an insert molding process with the wire bonded pin grid array substrate as the insert. The tight dimensional tolerances which can be held on part sizes are extremely favorable in controlling the flash of encapsulant at the part edges. Additionally, the flexibility in filler composition for the injection molded substrate allows for a good matching of coefficients of thermal expansion of the substrate with the encapsulant. The transfer molding encapsulation procedure yields a package with very consistent properties as well as desirable aesthetics and overall package appearance.

As in the cavity down pin grid array package, the cavity up pin grid array package can be configured to include more than one semiconductor chip or electronic device. Additionally, standoffs 172a may be molded into the cavity up pin grid array package to provide a ventilation passage between the cavity up pin grid array package and the board.

Figure 7A:
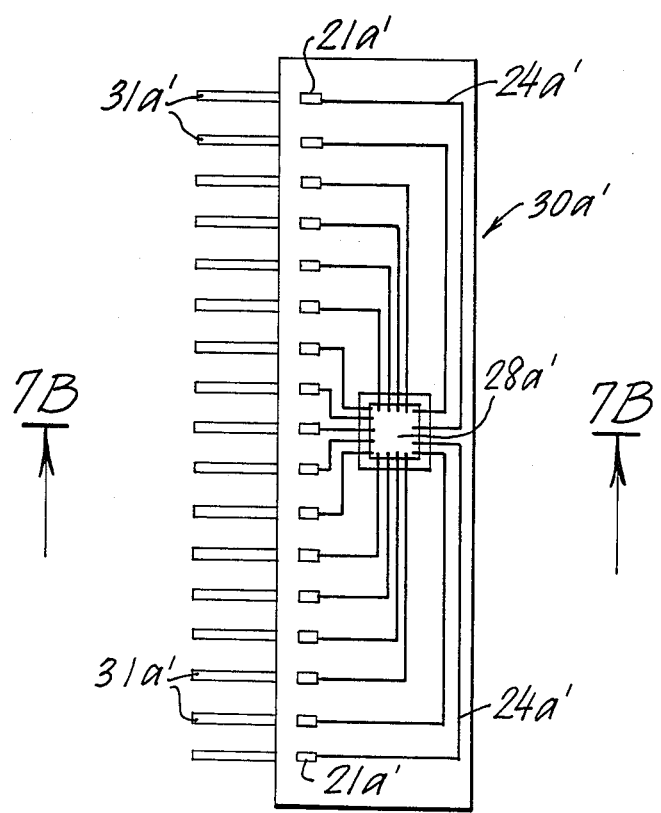
FIG. 7A is a plan view of an alternative embodiment of the interconnection package.
Figure 7B:
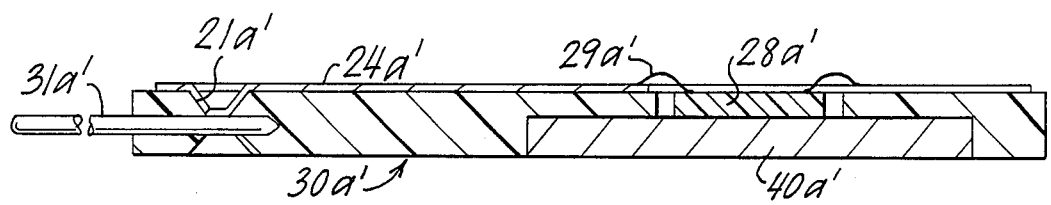
FIG. 7B is a sectional view of the interconnection package taken along line 7B—7B of FIG. 7A.

FIGS. 7A and 7B illustrate an alternative configuration of the cavity up pin grid array package in which the pins 31a extend from the side of the pin grid array 30a instead of from the bottom. Other details of fabrication and assembly are as previously described and similar features are numbered correspondingly with a prime designation.

C. THIN LAYER PIN GRID ARRAY PACKAGES

The conductive pattern for the pin grid array packages may also be produced on a thin inner layer in a manner similar to establishing a conductive pattern on conventional printed wiring board base materials. The pin grid array and cover are molded in a separate process and the thin inner layer conductive pattern attached with an adhesive to the pin grid array. The pins may then be electrically connected to the conductive pattern and an electronic device wire bonded into place.

A thin layer pin grid array package according to the invention (FIG. 8) includes three basic components; a thin inner layer 50c, a molded pin grid array 30c, and a molded cover 20c.

Preferably, the thin inner layer 50c comprises copper foil, preferably 0.0007 inches (18 micrometers) thick, which is bonded to a plastic laminate 0.008 inches (0.2 mm) thick (e.g., polyimide/glass or expoxy/glass laminates). The conductive pattern is produced on at least one side of the thin inner layer by well known printed wiring techniques. The copper foil is laminated with a conventional aqueous dry film photo resist and imaged to leave a polymerized resist in the image of the desired conductive pattern. The unexposed photo resist is stripped away with an alkaline solution and the exposed copper areas are etched, using standard cupric chloride or similar etchants, to leave only the desired conductive pattern. The exposed photo resist is then removed leaving copper conductors in the desired conductive pattern.

Thereafter, the conductive pattern is screen printed with a conventional aqueous resist ink leaving only the ends of the conductors at the attach recess exposed. The ends of the conductors at the attach recess are selectively plated with approximately 150 millionths of an inch of nickel followed by approximately 40 millionths of an inch of soft (bondable) gold. The ink photo resist is stripped away with an alkaline solution and the surface is ammonia-dipped to remove any copper ions from the gold to insure a bondable surface. The thin inner layer is then fabricated to the desired final assembly form by punching holes adapted to align with the pin configuration of the pin grid array, punching out the attach area, and conforming the finished thin inner layer to the desired final part outline. It will be appreciated that as part of producing the conductive pattern, the through holes may be plated through on one or both sides to provide an improved pin-to-conductive-pattern electrical connection.

Figure 8:
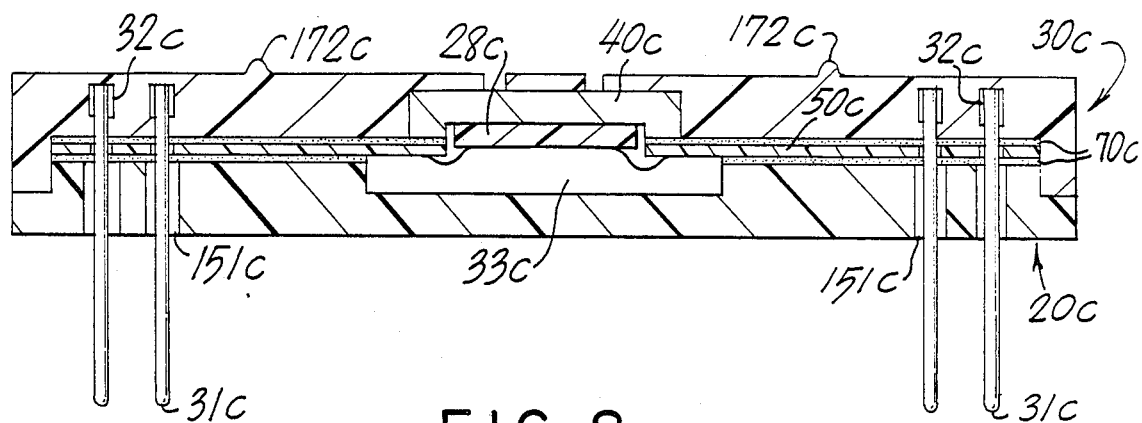
FIG. 8 is a sectional view of the thin layer pin grid array package.

In a separate process, the pin grid array 30c and the cover 20c of the thin layer pin grid package are injection molded and appear as shown in FIG. 8. The pin grid array 30c may be molded from any of the moldable materials as set forth above. Molded into the pin grid array are a multiplicity of pins 31c and an attach insert 40c. Preferably, the diameter of the pins in the pin grid array is slightly larger than the diameter of the punched holes in the thin inner layer to insure good electrical contact when the thin inner layer is press fit over the molded pin grid array. Additional molded-in features (e.g., heat sink (not shown), starred pins 32c, or standoffs 172c) may be incorporated into the thin layer pin grid array package as in other pin grid array packages previously described. Molded into the cover 20c are a multiplicity of through holes 151c adapted to align with the pins 31c of the pin grid array and a recess area 33c to allow clearance for a wire bonded semiconductor chip 28c.

The thin inner layer 50c is attached to the pin grid array 30c by applying an adhesive 70c to the inside surface of the pin grid array and pressing the thin inner layer onto the pins 31c. Once the adhesive 70c has cured, the pin-to-conductive-pattern press fit connections may be enhanced by either a conductive epoxy or reflowed solder preforms or solder paste. A semiconductor chip 28c may thereafter be attached to the pin grid array 30c by an adhesive and connected to the conductors by conventional wire bonding techniques.

An epoxy adhesive 70c may be applied to the exposed surface of the thin inner layer 50c and the cover 20c registered over the pin grid array such that the pins 31c of the pin grid array align with the holes 151c of the cover. The cover 20c may then be pressed into place and the epoxy adhesive allowed to cure. Thereafter, the interface between the cover and the pin grid array 30c may be sealed to further protect the package.

Figure 9:
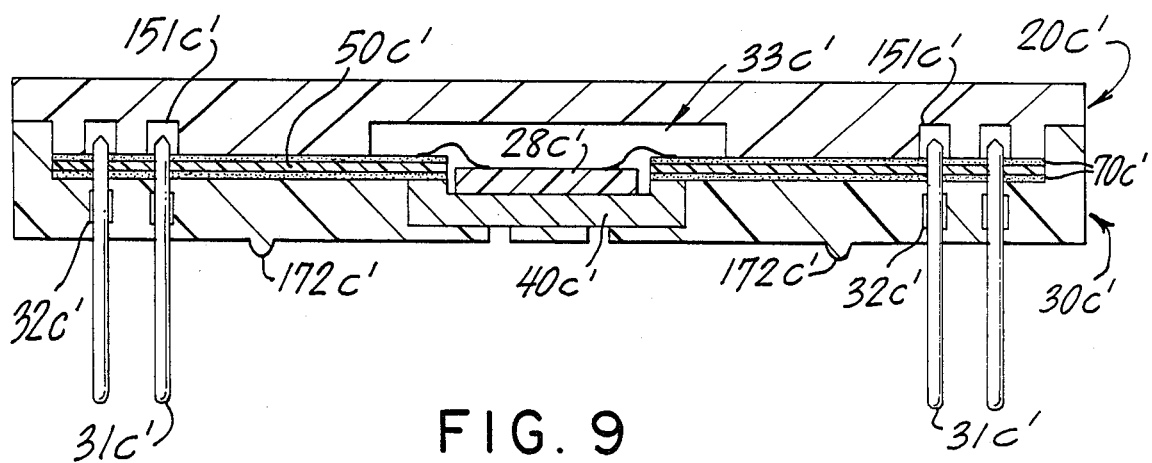
FIG. 9 is a sectional view of an alternative embodiment of the thin layer pin grid array package.

FIG. 9 illustrates an alternative embodiment of the thin layer pin grid array package in which the package is in a "cavity up" configuration. The details of fabrication and assembly are generally as described above and similar features are numbered correspondingly with a prime designation. Either embodiment of the thin layer pin grid array package may be configured to include more than one semiconductor chip or electronic device.

The thin layer pin grid array packages according to the invention provide for relatively inexpensive production of the conductive pattern on a two dimensional surface. The thin inner layer is then easily fabricated to include the holes and attach area due to its minimal thickness. The need for the "swell and etch" process is eliminated in the thin layer pin grid array package and the pin-to-conductive-pattern connections are significantly simplified. Further, as the wire bondable surface is electroplated directly on the copper conductors, excellent bondability is achieved. This configuration also provides the ability to produce multi-level bonding pads and multiple layers of conductors for signal routing, power planes, ground planes, and other features.

The thin layer pin grid array package provides for extremely variable attach recess dimensions using the same tooling and allows for a fully or a selectively metallized attach cavity which may be accomplished off-line for enhanced economy. Considerable flexibility is provided in the choice of molding material for the packages and constraints on surface imperfections of insert molded parts are minimized.

D. MULTILAYER PIN GRID ARRAY PACKAGES

While the molded pin grid array packages described heretofore incorporated a single layer of electrical conductors, it may be desirable in many applications to incorporate multiple layers of conductive patterns into the package. Additional layers of conductors may be incorporated into the pin grid array package by first producing a conductive pattern on one or both sides of a thin planar inner layer of extruded or laminated material. The pins are then press fit into plated through-holes in the inner layer making electrical contact with the conductive pattern therein. The pin grid array package is then molded around the inner layer, completely encapsulating the inner layer and conductors. Thereafter, a conductive pattern may be applied to the surface of the pin grid array package to add additional conductive patterns and connectivity.

Figure 10:
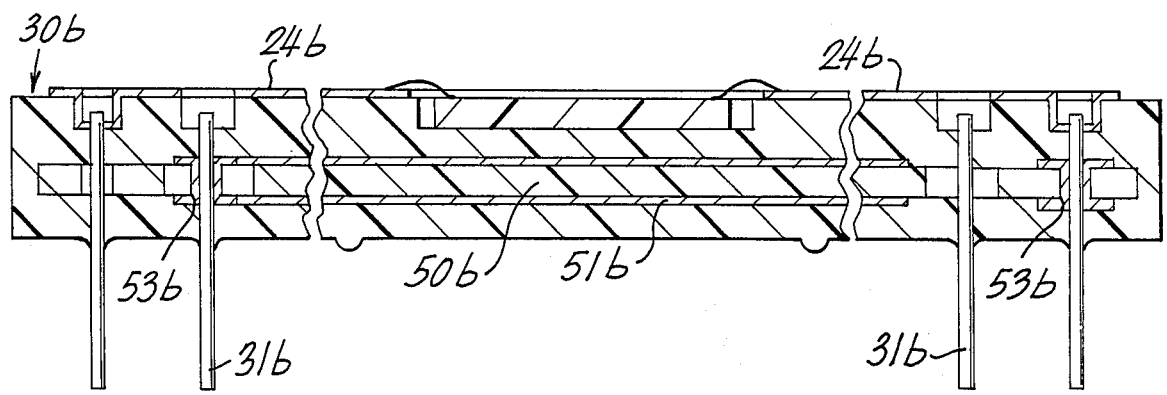
FIG. 10 is a side sectional view of the multilayer pin grid array package.

Such desired functions as power planes, ground planes, and even additional layers of signal traces may in some cases require the incorporation of more electrical conductors than could be accommodated in a single layer. A preferred method for incorporating multiple layers into the pin grid array package is as follows (see FIG. 10). First, the desired configuration of inner layers is produced. Optimally, this may be done starting with copper clad polyimide or epoxy/glass laminate 50b (0.15 to 0.20 mm thick) having 18 micrometers of copper on both sides and using conventional printed wiring board processing techniques. The inner layer 50b contains an interstitial via hole pattern 53b, selected holes of which match the pin configuration of the pin grid array 30b of which it is to become a part. Conductive pattern 51b may be formed on either one or both sides of the inner layer 50b, or the inner layer may even be made up of multiple inner layers (more than two).

Figure 11:
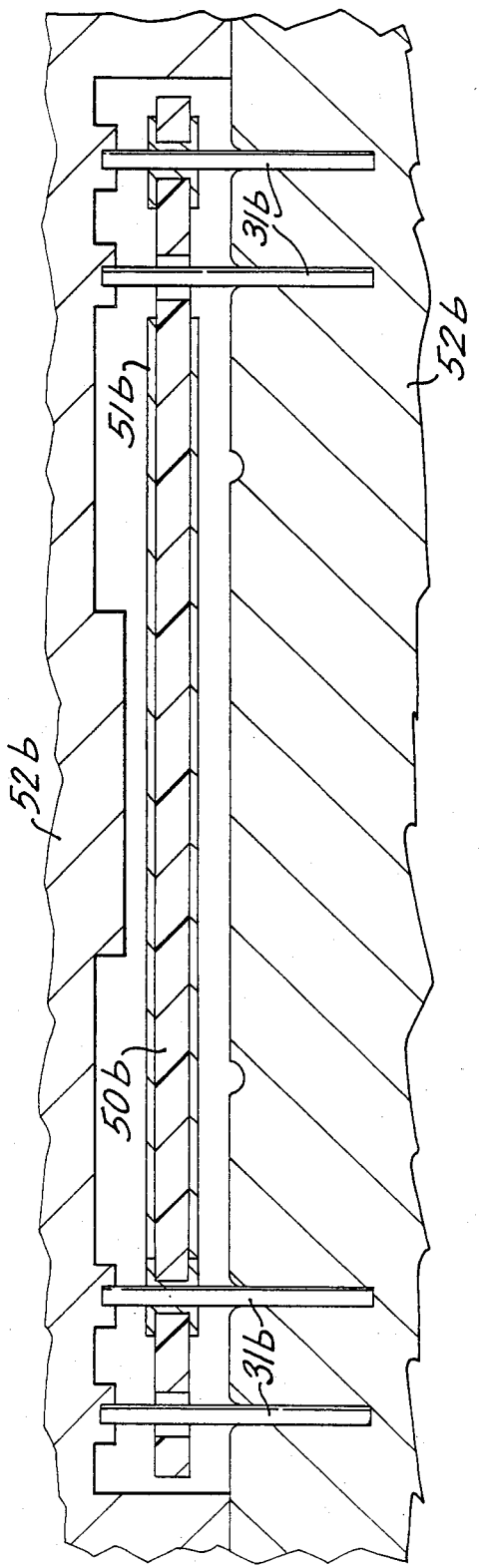
FIG. 11 is a side sectional view of the multilayer pin grid array package mold.

Subsequently, the pins 31b which are to be insert molded into the pin grid array 30b may be inserted into the flat inner layer 50b, or the pins 31b may first be placed in the mold 52b and the inner layer pressed on top of the pins as shown in FIG. 11. Advantageously, if the pins are inserted into the inner layer first, the pins will help register the inner layer in place for the final molding of the pin grid array. Either way, the pins 31b make a press fit mechanical connection to the inner layer 50b and an electrical connection to the conductors of any hole 53b which is plated through. It will be appreciated by the skilled artisan that the pins may also be insert molded into the inner layer and then electrically connected to the conductive pattern. Further, the pins may include anchoring means to anchor them in the inner layer.

The pin grid array 30b is then injection molded around the inner layer 50b as in the process as previously described with no inner layer around the pins. The thin planar inner layer is thus completely encapsulated in the molded pin grid array, as are the pin-to-interstitial-via-hole connections. The conductive pattern 24b is produced on the surface by the semi-additive, additive, or thick film process described herein above. Some of the pins are connected to both the recesses in the conductive pattern 24b, the intestitial via holes 53b, and some connected to either 24b or 53b. As described for the pin grid array packages above, a molded cover may be provided for the multilayer pin grid array package and attached to the pin grid array by ultrasonic welding techniques.

It will be appreciated that the multilayer method according to the invention uses the same tooling as for the molded pin grid array packages with no inner layers (assuming the pin configuration is the same) and with no modifications to the tooling. The multilayer method according to the invention also provides the opportunity for off-line loading of the pins, if such is deemed desirable for reasons of molding productivity. Additionally, the multilayer method completely encapsulates the inner layer and the inner layer connections and is extremely cost effective.

The pin grid array packages made according to the invention have substantial advantages over currently available ceramic and printed circuit laminate pin grid array packages:

(1) the comparative cost of the package according to the invention is significantly reduced, (2) the conductors are of a much better quality than can be achieved in the hybrid packages due to the material used and the photoimaging technique;

(3) the pins are securely anchored in a molded part;

(4) the glass transition temperatures, dielectric constants, and dissipation factors of the thermoplastics and thermosetting molding compounds are better than those of conventional printed circuit packages;

(5) pin recesses are achieved by a simple molding operation;

(6) heat sinks can be simply molded in place without requiring any significant fabrication steps;

(7) attach recesses are accurately molded in place and do not require milling or other fabrication steps;

(8) filled thermoplastic and thermoset materials provide a resin system with no continuous filler as in laminates thus eliminates the potential for growth of electrical "shorts" along the filler between tightly spaced conductors;

(9) wire bondability is excellent due to the high glass transition temperature and inherent material hardness of the filled thermoplastic resin system;

(10) integral molded-in standoffs eliminate the need for special pins at the corners of the pin grid array package to hold the pin grid array package off the interconnection board to which it is ultimately assembled; and

(11) the thermal coefficient of expansion of the package is closer to epoxy/glass laminates than that of ceramic pin grid array packages.

E. COMPONENT MOUNTING

The pin grid array package mounting method according to the invention utilizes tapered recesses in an interconnection board to accept the metal leads of the components and hold them in place allowing proper electrical/mechanical attachment to be accomplished. These recesses may be integrally molded into the interconnection board. A conductive pattern is then formed on the interconnection board, with the conductive pattern extending into the tapered recesses as desired. The leaded components can then be mounted into these tapered recesses and subsequently soldered into place.

Figure 12:
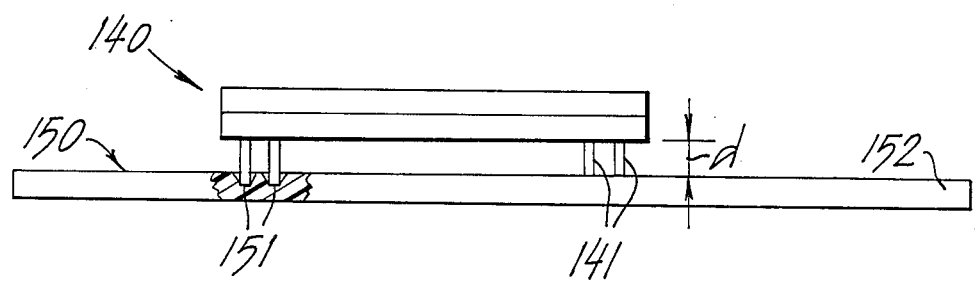
FIG. 12 is a side view of the pin grid array package mounted on an interconnection board according to the invention.

The invention herein described is adaptable for attaching pin grid array package 140 to an interconnection board or printed wiring board as shown in FIG. 12. Interconnection board 150 is fabricated as was base 20 of the cavity down pin grid array package, previously described, to provide a multiplicity of tapered pin recesses 151 on the interconnection board and a conductive pattern 152 thereon. The free end of the pins 141 from pin grid array package 140 are adapted to extend into the corresponding tapered pin recesses 151 on interconnection board 150 and make electrical contact with conductive pattern 152 therein. By controlling the length of the pins 141 and the depth of the tapered pin recesses 151 in interconnection board 150, the displacement (d in FIG. 12) of pin grid array package 140 off the interconnection board can be selected to allow a ventilation passage between the pin grid array package and the interconnection board.

Figure 13A:
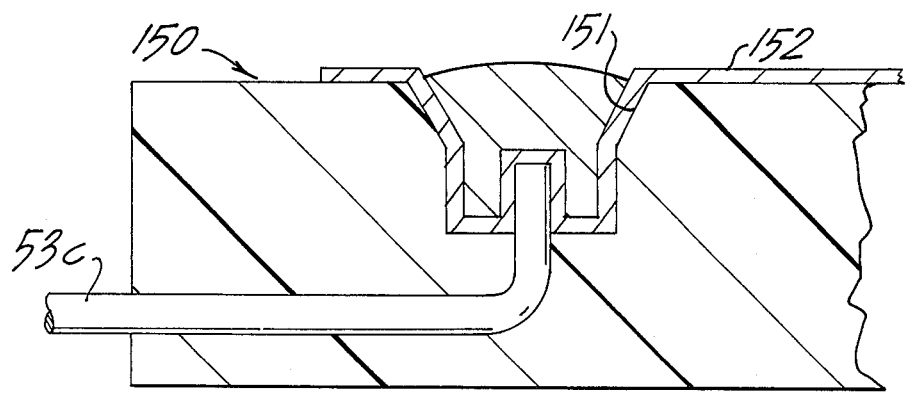
FIG. 13A is a side sectional view of an alternative embodiment of the mounting method according to the invention.
Figure 13B:
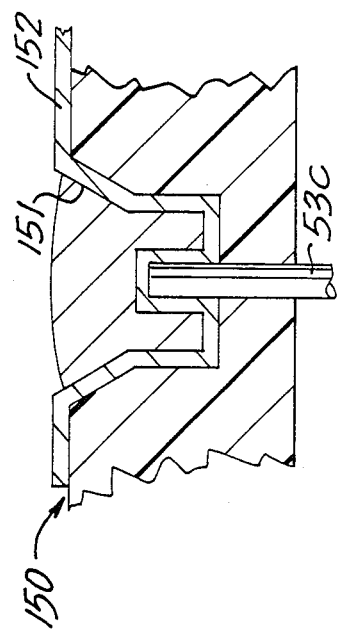
FIG. 13B is another alternative embodiment of the mounting method according to the invention.

A metal contact device 53c may also be insert molded into the interconnection board 150. (as shown in FIGS. 13A and 13B) and the contact device used as an electrical connector to electrically connect selected conductors to an outside cable or similar device mating with the contact device (e.g., an array of similar contact devices). The metal contact 53c extends through the molded material and into the area of a tapered recess 151 formed on the interconnection board 150. Electrical contact is made from the metal contact 53c to the conductive pattern 152 in a recessed area providing the advantage of greater solder joint attach area, as well as eliminating any protrusions off the surface of the molded material. Thus, handling problems during formation of the conductive pattern and assembly and the potential for mechanical damage of the metal contact 53c and/or interconnection board 150 are minimized.

Figure 14:
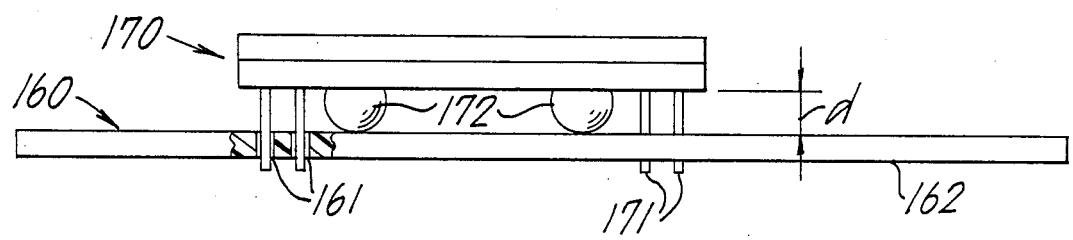
FIG. 14 is a side view of the pin grid array package mounted on a conventional interconnection board.

It will be appreciated that pin grid array packages according to the invention may also be mounted on conventional through-hole interconnection boards as shown in FIG. 14. Interconnection board 160 provides through-holes 161 adapted for mounting a pin grid array package 170. The free end of pins 171 are adapted to extend into and through the corresponding through-holes of interconnection board 160 and are soldered into place making electrical contact with conductive pattern 162 thereon. Standoffs 172 may be molded into the pin grid array to displace the pin grid array package 170 from the surface of the interconnection board 160 (d in FIG. 14). This provides a passage for ventilation and/or flux removal between the pin grid array package and the interconnection board.

Figure 15:
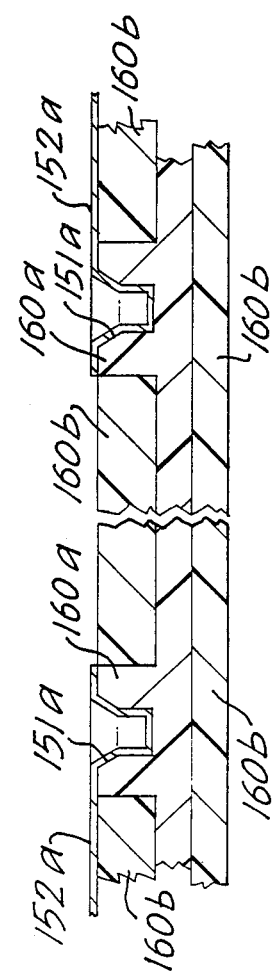
FIG. 15 is a side sectional view of an alternative embodiment of the mounting method according to the invention.

Advantageously, the mounting method described herein can be utilized in applications where either interconnection board is part of a casing or the printed wiring board surface is non-planar, or both. In this case (referring to FIG. 15), the method used to produce the conductive pattern on the molded material becomes somewhat different from conventional techniques such as screen printing and dry film imaging typical of planar materials. The preferred method for producting the conductive pattern in the assembly method is a "2-shot" molding process as described in U.K. Patent Publication No. 2,171,355 the disclosure of which is incorporated herein by reference. In the first molding operation, a palladium-catalyzed material 160a is used to form the substrate (including pin recesses 151a) for conductive pattern 152a. In the second molding operation, an uncatalyzed material 160b is used to form the bulk of the molded material.

The molded material may be any of a variety of moldable plastic materials, including polyetherimide, polyarylsulfone, polysulfone, polyetheretherketone, polyethylene terphthalate, polybutylene terphthalate, and polyphenylene sulfide, with the appropriate constraints of board processing and assembly. The metal contact material on any insert molded contacts can be made from a variety of metals including copper, tin, Ni/Fe alloys, and gold with the appropriate required contact characteristics.

The part, as molded, can then be selectively metalized without any additional image-defining steps. The metalizing technique involves first adhesion promotion of the surface of the part. This adhesion promotion involves a "swell" step, done with a mild solvent for the molded material (N-methyl pyrrolidone), and an "etch" step, done with successive exposure to hydrochloric acid and chromic acid. The part is then exposed to an electroless copper plating bath. In this bath, the copper adheres to the exposed catalyzed portions of the part due to the presence of the palladium catalyst. Electroless copper does not adhere to those areas where palladium is not present.

The part is then ready to accept components in an assembly operation. As preferably embodied, a solder paste is applied to the tapered recesses to provide a reflowable solder substance in the contact areas. The components are then be inserted into the tapered recesses and the assembly subjected to conventional vapor phase of infra-red (IR) reflow technology to accomplish the formation of the solder joints.

F. COMPONENT CARRIERS

To produce a conductive pattern on the molded material of the cavity up pin grid array package, the individual pin grid array packages are molded as single units and then fitted into a reusable component carrier. The component carrier may serve the dual purpose of providing chemical protection for the back side of the pin grid array package and allowing for simplified mass processing and handling of pin grid array packages.

The component carrier according to the invention is similar in structure to a molded plastic ice cube tray and provides a multiplicity of pockets, each pocket adapted to accept an individual component. Individual components are inserted into the pockets of the carrier and are held in place by means of an interference fit. In order to further protect the individual component, a seal may be added at the component/component carrier interface to prevent seepage of chemicals into the cavity behind the component.

Figure 16:
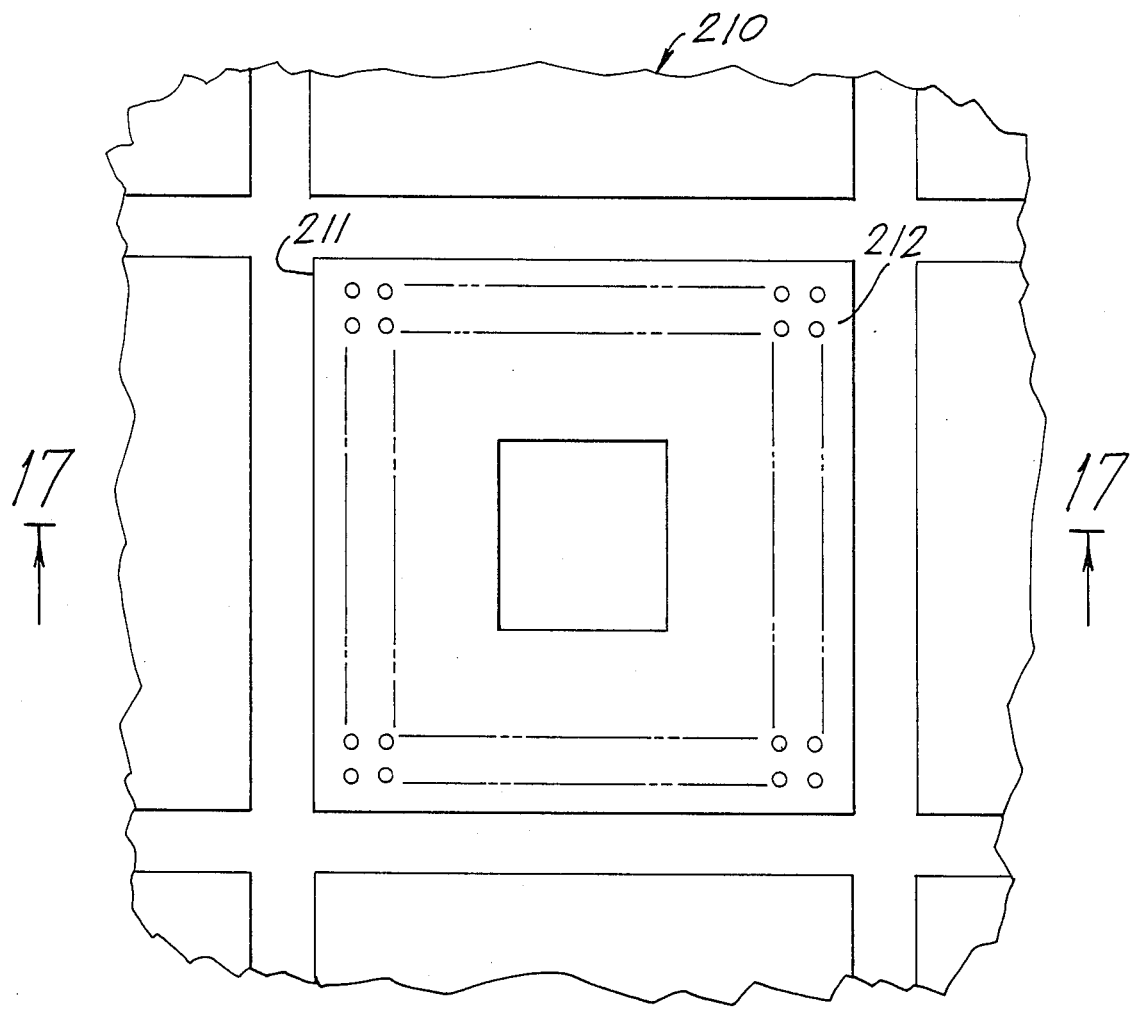
FIG. 16 is a plan view of the component carrier according to the invention.
Figure 17:
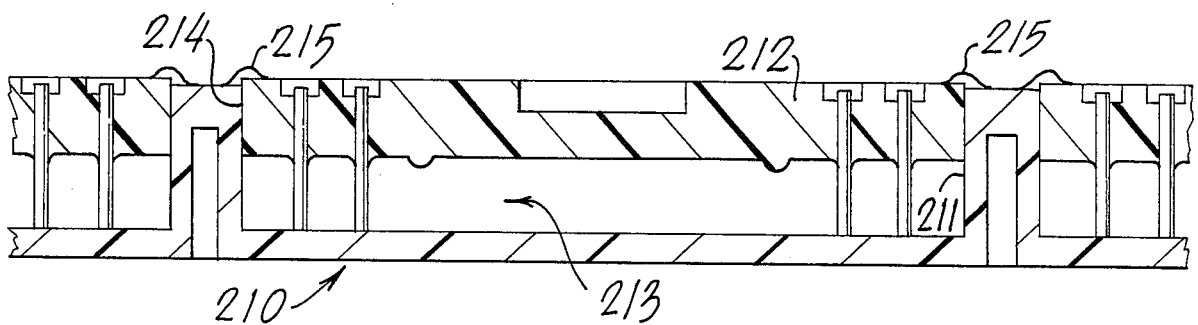
FIG. 17 is a side sectional view taken along line 17-17 of FIG. 16.

The component carrier according to the invention is preferably molded of polypropylene as shown in FIG. 16. A multiplicity of pockets 211 are provided in the component carrier 210, each pocket designed to accept an individual component 212 (e.g., a molded pin grid array package) as shown in FIG. 17. A press fit is provided to retain the individual pin grid array packages in the pockets of the component carrier.

While the above-defined configuration fulfills most of the requirements of the component carrier, the interference fit in many cases may not provide adequate protection from chemical seepage into the cavity 213 behind the individual pin grid array packages 212. However, the process used to produce a conductive pattern on the molded pin grid array packages also provides the opportunity to seal the interface 214 between the molded pin grid array packages 212 and the component carrier 210 by screen printing, roller coating, or laminating a resist 215 over the interface 214. As this will often be part of the image forming process and is generally the first step in the conductive pattern formation process, the sealing can often be done at little or no cost. Thereafter, the component carrier 210 with molded pin grid array packages 212 may be processed in a manner similar to standard flat laminates.

The component carriers according to the invention provide substantial advantages such as:

(1) allowing metalization on a single side of the component while protecting the other side;

(2) resisting the chemistry and temperatures used in the processes;

(3) providing predictable locational accuracy for multiple injection molded boards;

(4) meeting the dimensional requirements of the conductive pattern formation process;

(5) being inexpensive to process;

(6) being reusable;

(7) providing mechanical protection for the back side of the component;

(8) being flexible enough to handle a wide range of component configurations; and (9) allowing for the mass processing and shipping of small individual components.

It will be understood that numerous modifications may be made to the above-described embodiments within the scope and spirit of the invention. For example, while the pin grid array packages described herein contain a semiconductor chip, use of the pin grid array package with any electronic device is also contemplated. Further, while the pin grid array packages described herein provide an attach recess, use of pin grid array package with electronic devices surface mounted on the substrate with conductors is also contemplated.

The pins in each of the above-described embodiments have been generally round and straight in shape but many other pin or contact lead configurations are also contemplated. The pins of the package may, for example, be replaced with stamped metal contact leads as shown in FIGS. 18 and 19 wherein the contact leads 301 are integrally connected to a carrier strip 302. Each contact lead 301 is generally L-shaped with one end adapted to make connection with the circuitry pattern of the package and on the other end adapted to extend out of the package and be used as an electrical connector. Each contact lead 301 also includes a break-line 303 at the connection between the contact lead 301 and the carrier strip 302.

Advantageously, if for example a 64 lead package was desired, the carrier strip 302 may be fabricated into 4 sections each having 16 contact leads. The 4 sections, one for each side of the package, may then be insert molded into the package and, once molding is completed, the carrier strip snapped off along the break-line. FIG. 20 illustrates the use of this type of contact lead in an above-described thin layer package 304.

As many apparently widely different embodiments of the invention may be made without departing from the spirit and scope therein, it is to be understood that the invention is not limited to the specific embodiments described herein and is to be defined only in accordance with the appended claims.

What is claimed:

1. A method of producing an interconnection package in which at least one electronic device, such as a semiconductor chip, is attached to metallic conductors, which package is suitable for mounting on and electrically connecting to an interconnection board, the method comprising:

providing a multiplicity of metallic leads or pins;

molding a plastic material around the multiplicity of metallic leads or pins to form a first substrate which contains a multiplicity of inserts comprised of the metallic leads or pins aligned in a regular array, the multiplicity of inserts extending through and outwardly from the first substrate;

providing a surface suitable for mounting the electronic device;

providing a conductive pattern on a surface to connect to the electronic device, the conductive pattern extending into a multiplicity of holes in the surface adapted to receive the multiplicity of inserts, the conductive pattern making electrical contact with the multiplicity of inserts; and electrically connecting the electronic device to the conductive pattern.

2. The method of claim 1, further comprising the steps of configuring the interconnection package as a cavity down pin grid array package, situating the surface with the conductive pattern on a second plastic substrate, the second plastic substrate containing the multiplicity of holes wherein the holes are recesses adapted to receive the multiplicity of inserts, and joining the two substrates together such that the multiplicity of inserts extend into the multiplicity of recesses and make an electrical connection with the conductive pattern.

3. The method of claim 1, further comprising the steps of configuring the interconnection package as a cavity up pin grid array package, situating the surface with the conductive pattern on the first substrate, extending the multiplicity of inserts into the multiplicity of holes wherein the holes are recesses and forming the conductive pattern around the multiplicity of inserts.

4. The method of claim 2, further comprising the step of molding into said second substrate a heat sink for the electronic device.

5. The method of claim 3, further comprising the step of molding into said first substrate a heat sink for the electronic device.

6. The method of claim 1, further comprising the steps of configuring the interconnection package as a pin grid array package, situating the surface with the conductive pattern on a second plastic substrate, the second plastic substrate containing the multiplicity of holes extending therethrough and adapted to receive the multiplicity of inserts, and joining the two substrates together such that the multiplicity of inserts extend into the multiplicity of holes and make an electrical connection with the conductive pattern.

7. The method of claim 6, further comprising the step of forming the second plastic substrate from a polyimide/glass or an epoxy/glass laminate.

8. The method of claim 6, further comprising the step of plating-through the multiplicity of holes.

9. The method of claim 6, further comprising the step of adhesively bonding the second plastic substrate to the first plastic substrate.

10. The method of claim 1, further comprising the steps of mounting the multiplicity of inserts in plated-through holes in a second substrate, the second substrate having a conductive pattern on one or more layers, and molding the first substrate around the second substrate.

11. The method of claim 1, further comprising the step of selecting said plastic material from the group consisting of polysulfones, polyethersulfones, polyetherimides, polyarylsulfones, polyesters, epoxy phenolic, diallyl phthalate, polyimide, and polyphenylene sulfides.

12. The method of claim 11, further comprising the step of reinforcing said plastic material with a filler selected from the group consisting of mineral flakes, milled glass, mineral powder fillers and chopped glass fibers.

13. The method of claim 1, further including the step of providing an anchoring means for each of said inserts.

14. The method of claim 1, further including the steps of:
   inserting the interconnection package into a molded carrier, said carrier providing a plurality of pockets, each pocket of said carrier adapted for holding an individual interconnection package; and
   simultaneously reproducing the conductive pattern on the interconnection package in said carrier.

15. The method of claim 14, further comprising the step of providing a seal between the interconnection package and the molded carrier.

16. The method of claim 2, further comprising the step of attaching said first substrate to said second substrate by a press fit of said multiplicity of inserts into said multiplicity of recesses making electrical connection with said conductive pattern therein.

17. The method of claim 2, further comprising the step of sealing the interface between the first substrate and the second substrate.

18. The method of claim 3, further comprising the step of attaching a protective cover over the electronic device.

19. The method of claim 18, further comprising the steps of providing said first substrate with an attach recess and providing said protective cover with a recess area to provide clearance above the electronic device.

20. The method of claim 19, further comprising the step of sealing the interface between said protective cover and said first substrate.

21. A method of attaching a pin grid array package to an interconnection board, comprising the steps of:
   providing a pin grid array package having a multiplicity of pins and at least one standoff extending therefrom;
   molding an interconnection board with a multiplicity of holes in the surface thereof and extending therethrough adapted to receive the multiplicity of pins;
   creating a conductive pattern on the surface of said interconnection board, said conductive pattern extending into said multiplicity of holes; and
   inserting the multiplicity of pins of the pin grid array package into the multiplicity of holes and making electrical contact with the conductive pattern within the holes.

22. A method of attaching a pin grid array package to an interconnection board, comprising the steps of:
   providing a pin grid array package having a multiplicity of pins extending therefrom;
   molding an interconnection board with a multiplicity of tapered recesses in the surface thereof adapted to receive the multiplicity of pins;
   creating a conductive pattern on the surface of said interconnection board, said conductive pattern extending into said multiplicity of tapered recesses; and
   inserting the multiplicity of pins of the pin grid array package into the multiplicity of tapered recesses, attaching the pin grid array package to the interconnection board by a press fit of said multiplicity of pins into said multiplicity of tapered recesses, and making electrical contact with the conductive pattern within the tapered recesses.

23. A method of attaching a pin grid array package to an interconnection board, comprising the steps of:
   providing a pin grid array package having a multiplicity of pins extending therefrom;
   molding an interconnection board with a multiplicity of tapered recesses in the surface thereof adapted to receive the multiplicity of pins;
   selecting the length of said multiplicity of pins and the depth of said multiplicity of tapered recesses to provide a ventilation passage between the pin grid array package and the interconnection board;
   creating a conductive pattern on the surface of said interconnection board, said conductive pattern extending into said multiplicity of tapered recesses; and
   inserting the multiplicity of pins of the pin grid array package into the multiplicity of tapered recesses and making electrical contact with the conductive pattern within the tapered recesses.

24. The method of claim 21, wherein the step of molding an interconnection board further comprises the steps of:
   molding an inner part from catalyzed material, said inner part providing a multiplicity of recesses therein;
   molding non-catalyzed material around said inner part; and
   creating a conductive pattern on the surface of said inner part, said conductive pattern extending into the multiplicity of holes or recesses.

25. The method of claim 21 further comprising the step of soldering said multiplicity of pins into said multiplicity of holes.

26. The method of claim 22, 23 or 24 wherein the step of molding an interconnection board further comprises the steps of:
 molding an inner part from catalyzed material, said inner part providing a multiplicity of recesses therein;
 molding non-catalyzed material around said inner part; and
 creating a conductive pattern on the surface of said inner part, said conductive pattern extending into the multiplicity of recesses.

27. The method of claim 22, or 23 further comprising the step of soldering said multiplicity of pins into said multiplicity of recesses.

28. An interconnection package for attaching electronic devices, such as semiconductor chips, to an interconnection board, comprising:
 a multiplicity of metallic leads or pins aligned in a regular array;
 a first substrate of molded plastic material around said metallic leads or pins, said metallic leads or pins extending through the first substrate;
 a conductive pattern formed on a surface, said conductive pattern being adapted to electrically connect to the electronic devices, the conductive pattern extending into a multiplicity of holes, and each of said metallic leads or pins extending into a corresponding hole and making an electrical connection to the conductive pattern within the hole.

29. The interconnection package of claim 28, said interconnection package being a cavity down pin grid array package wherein said conductive pattern is situated on a second substrate containing the multiplicity of holes wherein the holes are recesses and adapted to receive the multiplicity of metallic leads or pins and wherein the first substrate and the second substrate are joined together such that the multiplicity metallic leads or pins extend into the multiplicity of recesses and make an electrical connection with the conductive pattern therein.

30. The interconnection package of claim 28, said interconnection package being a cavity up pin grid array package wherein the first substrate has the surface with the conductive pattern thereon and wherein each of said metallic leads or pins extends into a corresponding hole, said hole being a recess on the first substrate, and the conductive pattern is formed around the ends of the metallic leads or pins.

31. The interconnection package of claim 28, said interconnection package being a pin grid array package wherein said conductive pattern is situated on a second substrate containing the multiplicity of holes extending therethrough and adapted to receive the multiplicity of metallic leads or pins and wherein the first substrate and the second substrate are joined together such that the multiplicity metallic leads or pins extend into the multiplicity of holes and make an electrical connection with the conductive pattern.

32. The interconnection package of claim 31, wherein the second substrate is a polyimide/glass or an epoxy-/glass laminate.

33. The interconnection package of claim 28, wherein said first substrate additionally contains internal conductive layers and interstitial via holes.

34. The interconnection package of claim 28, wherein said multiplicity of metallic leads or pins are insert molded into said first substrate.

35. The interconnection package of claim 34, wherein each of said metallic leads pins include and anchoring means.

36. The interconnecting package of claim 35, wherein said anchoring means is located at the central portion of that section of each pin molded into the first substrate.

37. The interconnection package of claim 29, wherein said second substrate further includes a molded-in heat sink for the electronic devices.

38. The interconnection package of claim 30, wherein said first substrate further includes a molded-in heat sink for the electronic devices.

39. The interconnection package of claim 28, wherein said first substrate further includes at least one molded-in setoff.

40. The interconnection package of claim 28, wherein said molded plastic material is a molded polymer selected from the group consisting of polysulfones, polyethersulfones, polyetherimides, polyarylsulfones, polyesters, epoxy phenolic, diallyl phthalate, polyimide, and polyphenylene sulfides.

41. A method of producing pin grid array package in which at least one electronic device, such as a semiconductor chip, is attached to metallic conductors, which package is suitable for mounting on and electrically connecting to an interconnection board, the method comprising:
 providing a multiplicity of metallic leads or pins;
 molding a plastic material around the multiplicity of metallic leads or pins to form a first substrate which contains a multiplicity of inserts comprised of the metallic leads or pins aligned in a regular array, the multiplicity of inserts extending through and outwardly from the first substrate;
 providing a surface on the first substrate suitable for mounting the electronic device;
 providing a conductive pattern on a second plastic substrate to connect to the electronic device, the second plastic substrate containing a multiplicity of holes extending therethrough and adapted to receive the multiplicity of inserts;
 adhesively bonding the two substrates together such that the multiplicity of inserts extend through the multiplicity of holes and make an electrical connection with the conductive pattern; and
 electrically connecting the electronic device to the conductive pattern.

42. A pin grid array package for attaching electronic devices, such as semiconductor chips, to an interconnection board, comprising:
 a multiplicity of metallic leads or pins aligned in a regular array;
 a first substrate of molded plastic material around said metallic leads or pins, said metallic leads or pins extending through and outwardly from the first substrate;
 a condutive pattern formed on a second substrate containing a multiplicity of holes extending therethrough and adapted to receive the multiplicity of metallic leads or pins; and
 wherein the first substrate and the second substrate are adhesively bonded together such that the multiplicity of metallic leads or pins extend through the multiplicity of holes and make electrical connection with the conductive pattern and wherein said conductive pattern is adapted to electrically connect to an electronic device.

* * * * *